(12) United States Patent
Zeller (10) Patent No.: US 10,598,748 B2
(45) Date of Patent: Mar. 24, 2020

(54) METHOD AND APPARATUS FOR SIMULTANEOUS MAGNETIC RESONANCE MULTI-CONTRAST DATA ACQUISITION

(71) Applicant: Siemens Healthcare GmbH, Erlangen (DE)

(72) Inventor: Mario Zeller, Erlangen (DE)

(73) Assignee: Siemens Healthcare GmbH, Erlangen (DE)

(*) Notice: Subject to any disclaimer, the term of this patent is extended or adjusted under 35 U.S.C. 154(b) by 0 days.

(21) Appl. No.: 16/145,900

(22) Filed: Sep. 28, 2018

(65) Prior Publication Data
US 2019/0101606 A1    Apr. 4, 2019

(30) Foreign Application Priority Data

Sep. 29, 2017   (EP) .................................. 17194004

(51) Int. Cl.
*G01R 33/483* (2006.01)
*G01R 33/561* (2006.01)
(Continued)

(52) U.S. Cl.
CPC ..... *G01R 33/4835* (2013.01); *G01R 33/3852* (2013.01); *G01R 33/50* (2013.01);
(Continued)

(58) Field of Classification Search
CPC ............... G01R 33/46; G01R 33/4608; G01R 33/4616; G01R 33/4625; G01R 33/4633;
(Continued)

(56) References Cited

U.S. PATENT DOCUMENTS 4,734,646 A    3/1988  Shenoy et al.
6,097,185 A    8/2000  Watanabe et al.
(Continued)

OTHER PUBLICATIONS

Poupon, et al. "Real-time EPI T1, T2 and T2* mapping at 3T" ISMRM, Proc. Intl. Soc. Mag. Reson. Med., Vo. 18, (2010).
(Continued)

*Primary Examiner* — Tung X Nguyen
(74) *Attorney, Agent, or Firm* — Schiff Hardin LLP (57) ABSTRACT

In a method and magnetic resonance (MR) apparatus for simultaneous multi-contrast recording, at least two different slices are repeatedly excited to generate echo signals of the respective slices, and the echo signals are recorded as scan data. In one repetition of the excitation and recording, one of the at least two slices is excited using desired first contrasting scan parameters for generating scan data weighted with a first contrast, and at least one other of the at least two slices is excited using desired second contrasting scan parameters for generating scan data weighted with a second contrast. The repetitions are repeated using the different desired first and second contrasting parameters, so that in each repetition, scan data of one slice weighted according to a first contrast and scan data from another slice weighted according to a second contrast are recorded and stored as scan data sets. A strongly accelerated recording of scan data with an increased information content without quality losses is thereby enabled.

14 Claims, 5 Drawing Sheets

(51) Int. Cl.
*G01R 33/56* (2006.01)
*G01R 33/50* (2006.01)
*G01R 33/385* (2006.01)
*G01R 33/54* (2006.01)
*G01R 33/563* (2006.01)

(52) U.S. Cl.
CPC ....... *G01R 33/543* (2013.01); *G01R 33/5602* (2013.01); *G01R 33/5611* (2013.01); *G01R 33/5616* (2013.01); *G01R 33/5607* (2013.01); *G01R 33/5617* (2013.01); *G01R 33/56341* (2013.01)

(58) Field of Classification Search
CPC .............. G01R 33/4641; G01R 33/465; G01R 33/543; G01R 33/56; G01R 33/5602; G01R 33/5604; G01R 33/5605; G01R 33/5607; G01R 33/5608; G01R 33/561; G01R 33/5611; G01R 33/5612; G01R 33/5613; G01R 33/5614; G01R 33/5615; G01R 33/5616; G01R 33/5617; G01R 33/5618; G01R 33/5619; G01R 33/563; G01R 33/56308; G01R 33/56316; G01R 33/56325; G01R 33/56341; G01R 33/56635; G01R 33/56358; G01R 33/56366; G01R 33/56375; G01R 33/56383; G01R 33/56391; G01R 33/565; G01R 33/56509; G01R 33/56518; G01R 33/56527; G01R 33/56536; G01R 33/56545; G01R 33/56554; G01R 33/56563; G01R 33/56572; G01R 33/56581; G01R 33/5659; G01R 33/567; G01R 33/5673; G01R 33/5676
See application file for complete search history.

(56) References Cited

U.S. PATENT DOCUMENTS

| | | | |
|---|---|---|---|
| 2012/0283549 A1* | 11/2012 | Miyazaki | G01R 33/5673 600/413 |
| 2015/0168521 A1* | 6/2015 | Ozawa | G01R 33/543 324/309 |
| 2015/0272453 A1* | 10/2015 | Heberlein | A61B 5/0263 600/419 |
| 2017/0108567 A1 | 4/2017 | Bhat et al. | |
| 2017/0146625 A1 | 5/2017 | Beck et al. | |
| 2017/0315202 A1 | 11/2017 | Bhat et al. | |
| 2018/0024214 A1 | 1/2018 | Bhat et al. | |
| 2018/0031659 A1 | 2/2018 | Bhat et al. | |
| 2018/0074147 A1 | 3/2018 | Carinci et al. | |
| 2018/0095150 A1 | 4/2018 | Zeller | |
| 2018/0348323 A1 | 12/2018 | Carinci et al. | |

OTHER PUBLICATIONS

Dietrich, et al. "Technical aspects of MR diffusion imaging of the body," European Journal of Radiology; vol. 76; pp. 314-322; (2010).

Breuer, et. al.: "Controlled Aliasing in Parallel Imaging Results in Higher Acceleration (CAIPIRINHA) for Multi-Slice Imaging"; in: Magnetic Resonance in Medicine; vol. 53; pp. 684-691; (2005).

Setsompop et al. "Blipped-Controlled Aliasing in Parallel Imaging for Simultaneous Multislice Echo Planar Imaging With Reduced g-Factor Penalty" Magnetic Resonance in Medicine; vol. 67; No. 5; pp. 1210-1224; (2012).

Breutigam et al. "Simultaneous Multi-Contrast Imaging with Readout-Segmented EPI" Proceedings 25th Annual ISMRM Meeting; (2017).

* cited by examiner

FIG 7

METHOD AND APPARATUS FOR SIMULTANEOUS MAGNETIC RESONANCE MULTI-CONTRAST DATA ACQUISITION

BACKGROUND OF THE INVENTION

Field of the Invention

The present invention concerns a method for the simultaneous generation of scan data representing different contrasts of an examination object by magnetic resonance technology.

Description of the Prior Art

Magnetic resonance (MR) technology is a known technology with which images of the interior of an examination object can be generated. Expressed simply, the examination object is positioned in a magnetic resonance scanner in a strong, static, homogeneous basic magnetic field, also known as the $B_0$ field, with field strengths of 0.2 tesla to 7 tesla or more, so that nuclear spins orient in the object along the basic magnetic field. In order to trigger nuclear resonances, radio-frequency excitation pulses (RF pulses) are radiated into the examination object and the nuclear spin resonances triggered thereby are detected as so-called k-space data and, on the basis thereof, MR images are reconstructed or spectroscopic data is determined. For spatially encoding the scan data, rapidly switched magnetic gradient fields are overlaid on the basic magnetic field. The scan data recorded are digitized and stored as complex numerical values in a k-space matrix. From the k-space matrix populated with such values, an associated MR image is reconstructed, such as by a multi-dimensional Fourier transform.

The desire for ever faster MR recordings in the clinical environment is currently leading to a resurgence of methods in which a number of images are recorded simultaneously. In general, these methods can be characterized by at least during a part of the scan, targeted transverse magnetization of at least two slices is used simultaneously for the imaging process ("multi-slice imaging" or "slice multiplexing"). In contrast thereto, in established multi-slice imaging, the signal is recorded from at least two slices alternatingly, i.e. completely independently of one another with correspondingly long scan times.

Known methods for such imaging are, for example, Hadamard encoding, methods with simultaneous echo refocusing, methods with broadband data recording, and methods that use parallel imaging in the slice direction. The latter methods include, for example, the CAIPIRINHA technique, as described by Breuer et al. in "Controlled Aliasing in Parallel Imaging Results in Higher Acceleration (CAIPIRINHA) for Multi-Slice Imaging", Magnetic Resonance in Medicine 53, 2005, pp. 684-691, and the blipped CAIPIRINHA technique as described by Setsompop et al. in "Blipped-Controlled Aliasing in Parallel Imaging for Simultaneous Multislice Echo Planar Imaging With Reduced g-Factor Penalty", Magnetic Resonance in Medicine 67, 2012, pp. 1210-1224.

Particularly in the latter slice multiplexing method, a so-called multi-band RF pulse is used in order to excite two or more slices simultaneously or otherwise manipulate them, e.g. to refocus or saturate them. Such a multi-band RF pulse is, a multiplex of individual RF pulses, which would otherwise be used for manipulation of the individual slices to be manipulated simultaneously. By such multiplexing, a baseband-modulated multi-band RF pulse is obtained from the sum of the pulse forms of the individual RF pulses. The spatial encoding of the recorded signals in two directions (two-dimensional gradient encoding) is achieved by a commonly used gradient circuit. It is, however, also possible to excite and manipulate each of the slices to be excited from which echo signals are simultaneously recorded, i.e. within a recording of scan data, with individual, e.g. successively switched, RF pulses. A combined use of "individual slice" RF pulses and multi-band RF pulses is also possible.

The signals arising from all the excited slices are recorded collapsed in one data set by multiple receiving antennae, and are then separated according to the individual slices with the use of parallel acquisition techniques.

The aforementioned parallel acquisition techniques (PPA techniques), with which in general acquisition times for recording the desired data can be shortened by sampling that is incomplete according to Nyquist, i.e. an underscan (undersampling), of k-space include, for example, GRAPPA ("GeneRalized Autocalibrating Partially Parallel Acquisition") and SENSE ("SENSitivity Encoding"). In parallel acquisition techniques, the scan points in k-space that are not scanned (filled with acquired data values) during the undersampling are typically evenly distributed over k-space to be scanned according to Nyquist, so that, for example, every second (acceleration factor 2) or third (acceleration factor 3), etc., k-space row is scanned. In addition, the "missing" k-space data are reconstructed in parallel acquisition techniques with the use of coil sensitivity data. This coil sensitivity data of the receiving coils used during the recording of the scan data are determined from reference scan data, which samples fully according to Nyquist at least a region of k-space to be scanned, typically the central region.

In slice multiplexing methods, parallel acquisition techniques are used in order to separate again the scan data recorded simultaneously for different slices into scan data of the individual slices. Reference scan data must be determined for all the slices involved. This typically takes place in the context of a reference scan, performed in addition to the diagnostic scan, which measures the reference scan data individually for each required slice. Methods are also known in which, for determining the reference scan data, a separate reference scan is no longer necessary. Instead, for example, the reference scan is interlaced with the scanning of the slice multiplexing scan data, as described e.g. in United States Patent Application Publication No. 2018/0074147, or the reference data is determined from the slice multiplexing scan data, as described in the subsequently published EP17174507.

In order to be able to separate the resultant signals of the different slices, for example, a different phase (phase amount) is applied to each of the individual RF pulses (possibly before the multiplexing), for example by adding a different phase, in each case, which increases linearly (e.g. with the k-space coordinates in the phase encoding direction ($k_y$)). In this way, each slice can be impressed with a different phase gradient, so that the slices are displaced against one another in the image space. This displacement is controlled by the so-called "field of view (FOV) shift factor" or "interslice FOV shift". How an optimal FOV shift factor can be determined is described, for example, in the subsequently published DE102016218955.

In the CAIPIRINHA methods described in the aforementioned articles by Breuer et al. and Setsompop et al., by switching additional gradient blips or by additional modulation of the phases of the RF pulses of the multi-band RF pulses between the simultaneously excited slices, alternating further phase shifts are applied which generate displacements in the image space in the slice direction ("interslice FoV shifts"). These additional displacements in the image space improve the quality of the separation of the signals of the slices, in particular if the coil sensitivities have such slight differences in the sensitivity profiles of the individual coils used, that they are not sufficient for a reliable separation of the slices. Thus artifacts in the image data finally reconstructed from the recorded scan data are lessened.

The method that is most used to generate echo signals following an excitation of the nuclear spin is the so-called spin-echo method. In the simplest case, through radiation of at least one RF refocusing pulse following the radiation of the RF excitation pulse, the transverse magnetization is, so to speak, "turned" so that the dephazed magnetization is rephazed again and thus, following a time TE denoted as the echo time following the RF excitation pulse, a so-called spin echo SE is generated.

The excitation and scanning of the echo signals generated are repeated following a repetition time TR (e.g. by switching different gradients for position encoding) until the desired number of echo signals has been scanned and stored in k-space in order to image the examination object.

Among the SE sequences, in particular the TSE ("turbo spin echo") sequences which are also known by the names FSE ("fast spin echo") or RARE ("Rapid Acquisition with Refocused Echoes") sequences, are widely used in clinical application. The advantage of the TSE sequences over the "simple" SE sequence is that following an RF excitation pulse, a plurality of refocusing pulses are switched and that thereby, a plurality of spin echo signals SE are generated following an excitation (multi-echo sequence). By this technique, the data recording is accelerated since fewer repetitions of the sequence with different position encoding are necessary to measure all the desired data. The scan time for the whole of the k-space in TSE sequences is thus reduced according to the number of the echo signals refocused and recorded following an excitation, the so-called "turbofactor" as compared with conventional SE methods.

By contrast, nuclear spin stimulated by an RF excitation pulse can be manipulated by switching dephazing and rephazing gradients so that the signal decays faster than is due to the T2* decay inherent to the scanned tissue, but after a particular time, the echo time TE, following the RF excitation pulse, a so-called measurable gradient echo forms. Such sequences are typically denoted GRE sequences. GRE sequences also include variants which generate a plurality of (gradient) echo signals following an excitation and therefore belong to the multi-echo sequences. Prominent variants are EPI ("echo planar imaging") methods in which an oscillating readout gradient is used in which each change of the polarization direction of the gradient refocuses the transverse magnetization as far as the T2* decay allows, and thereby generates a gradient echo.

In the clinical use of magnetic resonance techniques, alongside the most often generated (contrast-weighted) MR images which represent the examination object in such a manner that anatomical information is presented very visibly, parameter maps that represent the local distribution of particular parameters of the examination object being imaged are also gaining importance. Possible parameters are, for example, relaxation parameters which reproduce the decay of the magnetization (in particular the longitudinal relaxation (T1-decay), the transverse relaxation (T2-decay) and the effective transverse relaxation (T2*-decay)), but also the proton density p or perhaps diffusion parameters.

In order to be able to create such parameter maps that represent the distribution of the proton density ρ or of the T1-decay constants or the T2-decay constants or the T2* decay constants, echo signals must be recorded at different echo times or inversion times (depending on the decay law; see next section), it is therefore useful to record this plurality of echo signals with a multi-echo sequence. From the scan data recorded at a common echo time or inversion time, an image data set can be created in each case. By fitting, such as pixel-by-pixel or voxel-by-voxel, the signal values obtained of the different image data sets to the respective decay laws (1) to (3), the local values of the parameters can be determined:

(1) T1-value and proton density ρ from:

$$S=|\rho(1-2 \exp(-TI/T1))|, \text{ with inversion time } TI.$$

(2) T2-value and proton density ρ from:

$$S=\rho \exp(-TE/T2), \text{ with echo time } TE.$$

(3) T2*-value and proton density ρ from:

$$S=\rho \exp(-TE/T2^*), \text{ with echo time } TE.$$

A method for obtaining proton density (ρ)-maps, T1-maps, T2-maps and T2*-maps using a single slice EPI sequence is described by Poupon et al. in "Real-time EPI, T1, T2 and T2* mapping at 3T", Proc. Intl. Soc. Mag. Reson. Med. 18, p. 4983, 2010, wherein EPI measurements with respective different inversion times were carried out successively in order to determine proton density maps and T1-maps (according to decay law (1)), spin echo EPI measurements, each with different echo times, to determine proton density maps and T2-maps (according to decay law (2)), and EPI scans with different echo times, for the determination of proton density maps and T2*-maps (according to decay law (3)), in each case of one slice, whereby the overall scan time was approximately 12 minutes.

For T1-maps, a preparation of the echo signals generated with corresponding RF inversion pulses is necessary. For other parameters, a preparation of the echo signals generated can also be necessary, i.e. the spins in or around a slice to be scanned are prepared in a desired manner before the excitation for generating the echo signals to be recorded with the aid of radiated RF pulses and/or switched gradients. This is the case, for example, for diffusion parameters.

In routine clinical practice, diffusion-weighted magnetic resonance (MR) images can provide important diagnostic information, for example in the case of diagnosing stroke and tumors. In diffusion-weighted imaging (DWI), for preparation, diffusion gradients are switched in particular directions, the diffusion of water molecules weakening the measured magnetic resonance signal along the diffusion gradients that are applied. Therefore, in regions with lower diffusion, a weaker signal attenuation takes place, so that these regions are imaged with a greater image intensity in an imaging magnetic resonance tomography (MRT) scan. The strength of the diffusion weighting is correlated to the strength of the applied diffusion gradients. The diffusion weighting can be characterized with the so-called b-value, which is a function of gradient parameters, for example, the gradient strength, duration or separation between the applied diffusion gradients. Due to the speed of these sequences, the recording of the resultant magnetic resonance signals usually takes place with a multi-echo sequence, for example, EPI.

During diffusion imaging, typically a number of images with different diffusion directions and weightings (characterized by the b-value) are recorded and combined with one another in order, for example, to calculate diffusion parameter maps, in particular of the diffusion parameters "Apparent Diffusion Coefficient" (ADC) and/or "Fractional Anisotropy" (FA). In the review article "Technical aspects of MR diffusion imaging of the body", European Journal of Radiology 76, pp. 314-322, 2010, Dietrich et al. provide an overview of known DWI methods.

As stated above, slice multiplexing methods enable the scanning of echo signals from two or more slices simultaneously within one scan data recording. By this technique, in multi-echo methods in which following a first excitation of spin, through radiation of RF pulses and/or switching of gradients, a number of echo signals are generated and recorded. Compared with single slice scans, the minimum repetition time TR which is required for the recording of all the desired echo signals following a first excitation can be shortened, since fewer echo signals have to be created if they are recorded from a number of slices simultaneously than if only scan data of a single slice is contained in each recorded echo signal. For example, if scan data are measured from n slices simultaneously, the time required for recording the desired echo signals of all the slices is reduced by the factor n.

However, in many MR applications, the minimum repetition time TR is not determined by the time needed to record all the desired echo signals following an excitation, but rather is dependent on the respective desired image contrast. If a contrast weighted according to the T1, T2 or T2* decay constants of the respectively imaged tissue is to be achieved, the repetition time TR must be sufficient to be able to image the desired decay processes, since otherwise the desired image contrast is not determinable in sufficient quality from the scan data. Therefore, the known slice multiplexing methods produce no time advantage in multi-echo methods which are to generate the MR images with a particular contrast.

In United States Patent Application Publication Nos. 2017/0108567, 2017/0315202, 2018/0024214 and 2018/00316659, methods are described as to how, by slice multiplexing methods, scan data can be recorded, from which MR images with different contrast weightings can be generated. A further such method is described in the article "Simultaneous Multi-Contrast Imaging with ReadoutSegmented EPI", Proc. Intl. Soc. Mag. Reson. Med. 25, p. 520, 2017 by Breutigam et al.

With that method, however, it is still not possible to record scan data in the shortest possible time from which different parameter maps can be determined.

SUMMARY OF THE INVENTION

It is therefore an object of the invention to enable recordings of MR scan data in a clinically acceptable short time span, from which MR images of an examination object can be generated with different contrast weightings and different parameter maps.

The method according to the invention for generating differently contrast-weighted scan data of an examination object by magnetic resonance technology includes the following steps.

(a) A number (N) of different slices ($S_1 \ldots S_N$) to be scanned are selected, as are a number of desired first contrasting scan parameters for generating scan data weighted with a desired first contrast and, in each case, a further number of desired second contrasting parameters for generating scan data weighted with at least one second contrast, whereby the first contrast and the second contrasts are each different.

(b) An MR scanner is operated in order to excite nuclear spins in one slice of the slices ($S_1 \ldots S_N$) to be scanned using a first contrasting scan parameter.

(c) The MR scanner is operated in order to excite nuclear spins in at least one other slice of the slices ($S_1 \ldots S_N$) to be scanned using a second contrasting scan parameter.

(d) The MR scanner is operated in order to acquired the generated echo signals of the excited slices ($S_i$, $S_j$) as scan data, and the scan data are stored in a scan data set.

(e) Steps (b) to (d) are repeated using different first contrasting scan parameters of the desired first contrasting parameters and using different second contrasting scan parameters of the desired second contrasting parameters, until all the slices to be scanned ($S_1 \ldots S_N$) have been excited at least once with each desired first contrasting scan parameter and at least once with each desired second contrasting scan parameter, and the echo signals generated thereby have been stored in a scan data set.

The scan data set can be a so-called "collapsed" scan data set in which the k-space data for the individual slices must be separated, such as by using a technique of the type used in PPA reconstruction. Alternatively, the scan data set may already be slice-specific, for an individual slice.

Image data from the scan data set can be reconstructed and made available as one or more data files for viewing at a display screen.

By repeatedly performing excitation according to the invention so as to generate echo signals and so as to acquire the echo signals generated in at least two different slices, wherein in one repetition of the excitation acquisition, one of the at least two slices is excited using different desired first contrasting scan parameters for generating scan data weighted with a first contrast, and wherein, in another repetition, at least one other of the at least two slices, excitation takes place using different desired second contrasting scan parameters for generating scan data weighted with a second contrast, scan data weighted according to different contrasts are generated. By the variation of the contrasting parameters of the respectively generated contrasts, the scan data recorded overall contain different information relating to the examination object being investigated. For example, parameter maps of parameters characterizing material present in the examination object, such as proton density or decay constants dependent upon the selected contrasts, can be determined. Thus, in the context of the inventive generation of different contrast-weighted scan data, a large quantity of information, including quantitative information relating to the examination object, can be obtained in a short recording time, which is valuable for a medical diagnosis.

As the desired contrasting parameters, in particular the echo times realized in the context of the excitation and recording of echo signals of a slice can be used, so that in each repetition, at least one slice is excited such that one echo time of a number of desired echo times is produced. In this way, T2 or T2*-weighted scan data according to a transverse decay can be recorded, from which (through the repeated recording with different echo times) the distribution of the decay constants T2 or T2* in the scanned slices can be established. If a T2-contrast is to be achieved, the echo signals are to be generated as spin echo signals. If a T2*-contrast is to be achieved, the echo signals are to be generated as gradient echo signals. This can also be established in the contrasting parameters in each case.

As desired contrasting parameters, desired preparations also can be used, so that in each repetition, one slice of the slices to be scanned is excited using a preparation of the desired preparations. In this way, scan data can be obtained that are weighted according to contrasts to be prepared, such as for example T1-contrast, diffusion contrasts, etc.

Thus, within a repetition of an excitation for generating echo signals in a first and in at least one second layer and acquisition of the echo signals generated in the first slice and the at least one second slice, the echo signals generated in the first slice can be prepared through a preparation from a number of desired different preparations, whereas the echo signals generated in the at least one second layer can be generated following an echo time from a number of desired different echo times. Such repetitions can be repeated using the different desired preparations and producing the different desired echo times, so that in each repetition, preparation-influenced echo signals from one slice and echo signals characterized by a particular echo time can be acquired from at least one other slice and stored as scan data sets.

By such an excitation of a first slice using a first preparation of different desired preparations and the excitation of at least one second slice that produces one echo time of different desired echo times in a common time window and the repetition of the aforementioned excitations of first and second slices, each with different preparations of the desired preparations and each realizing different echo times of the desired echo times, within a scan pass, scan data sets are generated for all the desired slices that are marked not only according to the desired preparation, but also scan data sets of the desired slices that have different degrees of weighting with regard to a transverse decay of the excitation of the spin according to the desired echo times. This achieves a strongly accelerated recording of scan data compared to known recording methods, but with an increased information content without quality losses is enabled.

From the scan data recorded accelerated in this way, therefore not only can image data weighted according to the desired preparation be created, but also (from the scan data sets of the different echo times) quantitative parameter maps can be created which supply further important information, in particular for clinical diagnosis.

The present invention also encompasses a magnetic resonance apparatus having a magnetic resonance scanner with a basic field magnet, a gradient coil arrangement, a radio-frequency antenna, and a control computer that operates the magnetic resonance apparatus so as to implement the method according to the invention, as described above.

The present invention also encompasses a non-transitory, computer-readable data storage medium encoded with programming instructions (program code) that, when the storage medium is loaded into a computer or computer system of a magnetic resonance apparatus, cause the computer or computer system to implement any or all embodiments of the method according to the invention, as described above.

The advantages and details described above in relation to the method according to the invention apply as well to the magnetic resonance apparatus and the electronically readable data storage medium according to the invention.

DESCRIPTION OF THE PREFERRED EMBODIMENTS

Figure 1:
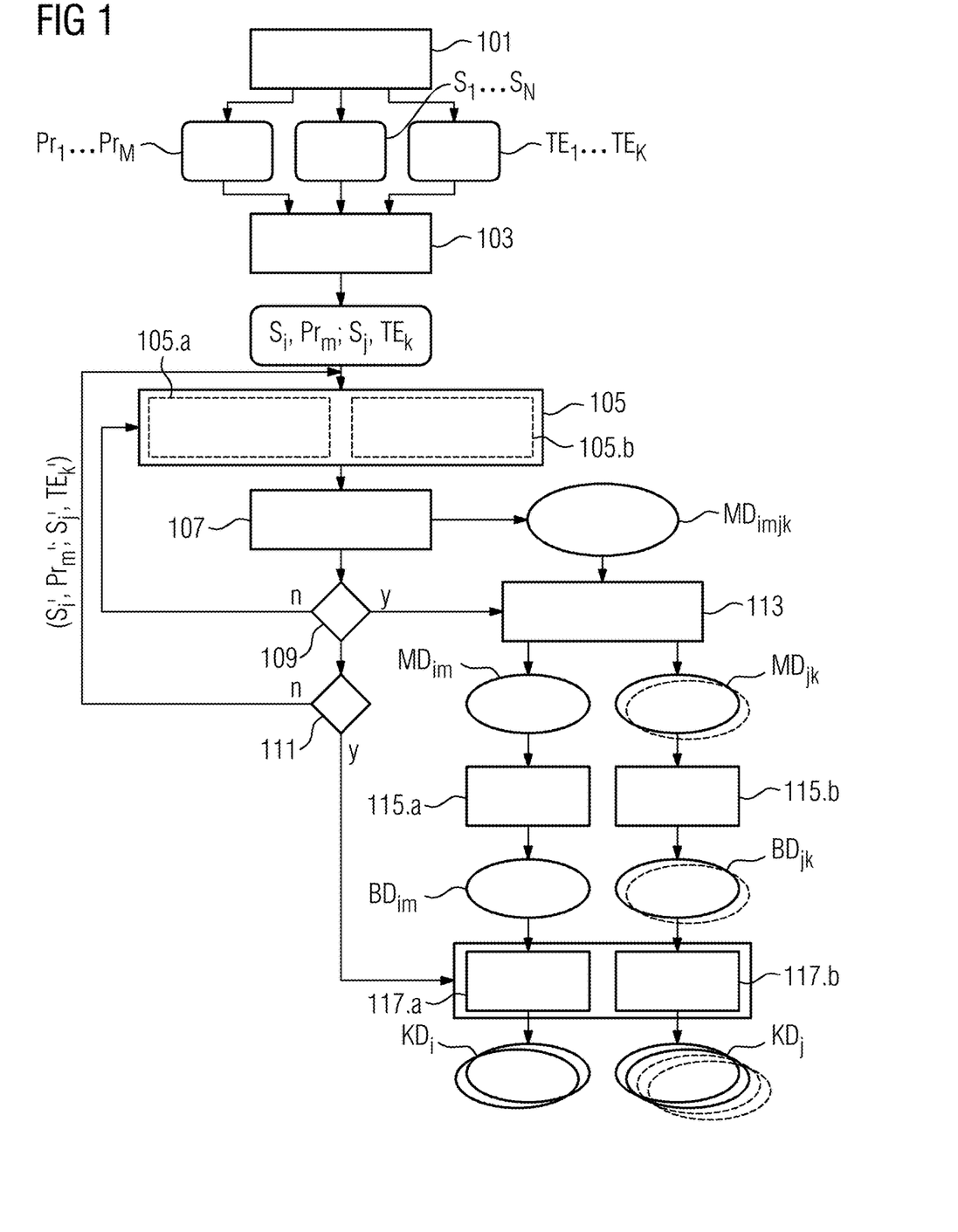
FIG. 1 is a flowchart of the method according to the invention.

FIG. 1 shows a flowchart of the inventive method for generating differently contrast-weighted scan data of an examination object by means of magnetic resonance technology.

As shown in FIG. 1, a number N of different slices $S_1 \ldots S_N$ to be scanned and a number of desired first contrasting scan parameters for generating scan data weighted with a desired first contrast and, in each case, a further number of desired second contrasting parameters for generating scan data weighted with at least one second contrast is selected (block 101). The first contrast and the second contrast are hereby different and can be selected from a group of contrasts which comprise, in particular, T1-contrast, T2-contrast and T2*-contrast.

Desired contrasting scan parameters can hereby be desired echo times $TE_1 \ldots TE_K$ which are to be realized in repetitions of an excitation for generating echo signals and the recording of the generated echo signals of a slice $S_j$ of the slices $S_1 \ldots S_N$ to be scanned.

Desired contrasting scan parameters can hereby be desired preparations $Pr_1 \ldots Pr_M$, which are to be used in repetitions of an excitation for generating echo signals of a slice $S_i$ of the slices $S_1 \ldots S_N$ to be scanned.

In particular, therefore, a number M of different desired preparations $Pr_1 \ldots Pr_M$ and a number K of different desired echo times $TE_1 \ldots TE_K$ can be selected.

The selected slices do not overlap, but lie, for example, parallel beside one another in the examination object being investigated and cover the region to be imaged (region of interest, ROI) in the examination object in a desired manner. The number N of the slices to be scanned is hereby at least equal to 2, so that in the process a first slice and at least one other slice of the N slices can be selected that can each be excited with contrasting parameters of different contrast levels and from which scan data can be recorded. The number N of slices is, in particular, equal to the number of different desired contrasts. By this means, in a repetition of an excitation for generating echo signals and recording of the generated echo signals, scan data for, in each case, one of all the desired contrasts can be obtained from another respective slice. A repetition therefore immediately provides scan data on each desired contrast (even if for different slices). If, for example, only two different contrasts are desired, for example T1 and T2 contrast or T1 and T2* contrast or T2 and T2* contrast, for which scan data are to be obtained with respectively different contrasting parameters, it is sufficient to select a number N=2 of slices per repetition.

The number M of desired preparations is at least equal to one, so that at least one preparation of the spin takes place in a first slice before the recording of the thus prepared echo signals. The excitation and recording of echo signals using a preparation always takes place with the same echo time.

As desired preparations, for example, preparations of a preparation type from the group of preparation types which comprise at least one RF inversion pulse come into consideration. With a preparation by at least one RF inversion pulse, for example, a T1 preparation or a suppression preparation of unwanted signals (e.g. by means of spectrally selective RF inversion coils) or ASL preparations (ASL="arterial spin labeling") can be achieved. The RF inversion pulses used herein are radiated a duration named the inversion time before an RF excitation pulse such that they have an effect on the echo signals recorded in the slice to be scanned. Different desired preparations $Pr_1 \ldots Pr_M$ can thus differ in the inversion time used, as a preparation value.

The desired preparations can however also be of a preparation type which comprises at least one RF magnetization transfer pulse. By means of RF magnetization transfer pulses, a magnetization transfer preparation can be achieved with which particular material (tissue types) lying in the ROI is suppressed, so that other material become more clearly visible. Different desired preparations $Pr_1 \ldots Pr_M$ can thus differ in the spectral selectivity used, as a preparation value.

The desired preparations, however, also can be preparations of a diffusion preparation type. Different desired preparations $Pr_1 \ldots Pr_M$ can thus differ in the diffusion values (b-values) and/or in the diffusion directions used, as a preparation value. If the desired preparations comprise at least two different diffusion values (b-value) and/or diffusion directions as preparation values, diffusion parameter maps can be created.

If at least two different preparations of one preparation type are selected, then in principle, from the scan data sets recorded respectively with another preparation value, quantitative parameter maps of parameters derivable from weightings imposed by the preparation can be obtained. However, the excitation and recording of echo signals using different preparations also always takes place with the same echo time so that the scan data of the first slices recorded with different preparations differ, as far as possible, only in the different preparation.

A number K of different desired echo times $TE_1 \ldots TE_K$ for the recording of scan data from at least one (second) slice is at least equal to 2, so that the parameter of the transverse magnetization decay dependent upon the echo time can be investigated. Whether the T2 decay or the T2* decay can be determined from the scan data sets recorded with the K different echo times is determined, in particular, by the manipulation of the spin undertaken during the excitation of a second slice. If the excitation of a second slice includes a refocusing coil for generating spin echo signals, the T2 decay is determined. If gradient echo signals are generated by the excitations of a second slice, the T2* decay is determined.

When choosing the desired echo times $TE_1 \ldots TE_K$, account can be taken of the fact that essentially two different echo times $TE_k$ are sufficient to be able to determine transverse decay constants, but that the determination can take place more exactly, firstly if the different echo times $TE_k$ have a sufficient temporal spacing from one another and, secondly the more different echo times $TE_k$ are scanned, i.e. the greater the number K is. After all, a larger number of values to be fitted to the associated decay law improves the result of the fit.

Following a selection 101 of N different slices $S_1 \ldots S_N$ to be scanned, M different desired preparations $Pr_1 \ldots Pr_M$ and K different desired echo times $TE_1 \ldots TE_K$, the first slices $S_i$ to be scanned respectively in a repetition with a preparation $Pr_m$ and, in the same repetition with echo times $TE_k$, per repetition at least one second slice $S_j$ to be scanned can be determined (block 103).

A repetition is started through the excitation of echo signals (block 105). Herein, a first slice $S_i$ of the N slices to be scanned is excited using a preparation $Pr_m$ of the desired preparations $Pr_1 \ldots Pr_M$ (block 105.a) and at least one second slice $S_j$ of the N slices to be scanned, where $S_i \neq S_j$, is excited such that an echo time $TE_k$ of the desired echo times $TE_1 \ldots TE_K$ is realized (block 105.b).

Figure 2:
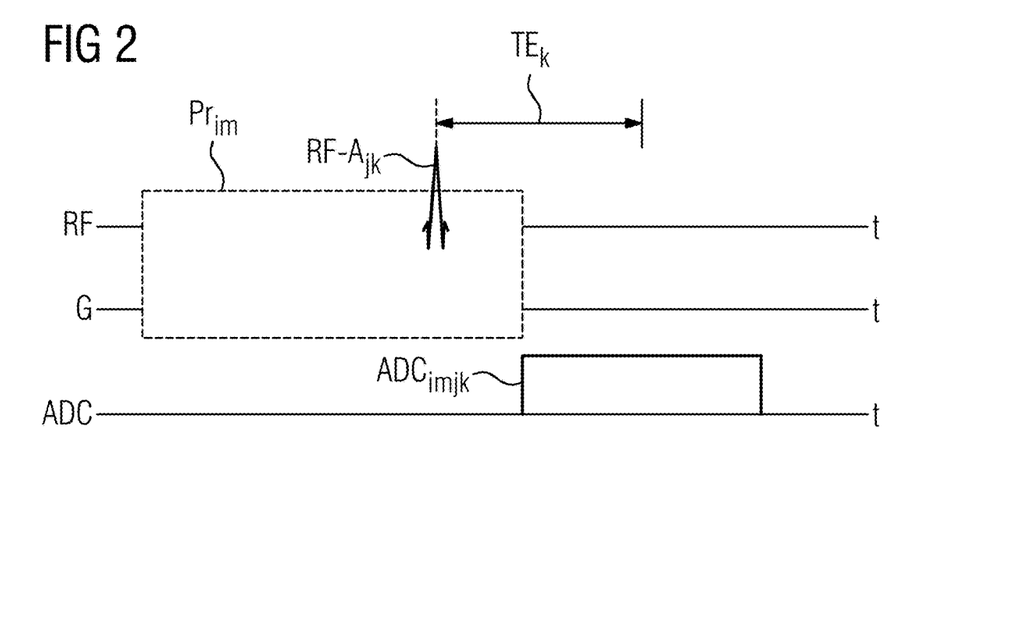
FIG. 2 is a simplified switching diagram of a repetition according to the invention.

A possible severely simplified switching diagram of a possible repetition of this type is shown roughly schematically in FIG. 2, plotted against time t. For the excitation of the first slice $S_i$, in the context of the desired preparation $Pr_{im}$ for the first slice $S_i$ RF pulses are radiated and gradients G switched in order to generate echo signals in the first slice $S_i$ which are recorded in at least one readout step $ADC_{imjk}$. In order to generate echo signals in at least one second slice $S_j$, at least one RF excitation pulse $RF-A_{jk}$ acting in the respective second slice $S_j$ is radiated such that in the (respective) second slice $S_j$ echo signals are generated which are recorded after an echo time $TE_k$ following the RF excitation pulse $RF-A_{jk}$ in, for example, the same readout step $ADC_{imjk}$. A repetition can be configured such that in the readout step $ADC_{imjk}$ the generated echo signals of all the excited slices $S_i$ and $S_j$ are recorded simultaneously. It is also possible for the echo signals of the different slices $S_i$ and $S_j$ to be recorded at least in some repetitions in separate readout steps (see e.g. FIG. 6).

The echo time $TE_k$ can thus be altered by varying the time point at which the RF excitation pulse $RF-A_{jk}$ is radiated (start point of the echo time, shown dashed). Further examples of possible switching diagrams of repetitions according to the invention are described below in relation to FIGS. 3 to 6.

In at least one repetition, the excitation 105.a of the first slice $S_i$ and the excitation 105.b of the at least one second slice $S_j$ can take place such that echo signals from the first slice $S_i$ and from the at least one second slice $S_j$ are generated simultaneously and are stored collapsed in a scan data set $MD_{imjk}$.

Furthermore, in at least one repetition, the excitation 105 of the first and second slices $S_i$ and $S_j$ involves at least one multi-band RF pulse, which simultaneously manipulates nuclear spins in at least two of the first and second slices $S_i$ and $S_j$. Herein, RF excitation pulses or RF refocusing pulses, in particular, which act in at least two of the first and second slices $S_i$ and $S_j$ come into consideration. Some examples are given below in relation to FIGS. 4 to 6.

The echo signals of the first and the at least one second slice $S_i$ and $S_j$ generated in the repetition are recorded as scan data (block 107) and the scan data are stored in a scan date set $MD_{imjk}$.

If, in a repetition, not all the scan data of the first and the at least one second slice $S_i$ and $S_j$ are recorded (thus if during the recording of the scan data, a "single shot" sequence is not used, but rather for example, a segmented multi-echo sequence is used), it can be checked whether all the scan data of the first slice $S_i$ and the at least one second slice $S_j$ have been recorded (query 109). If not all the scan data of the first and the at least one second slice $S_i$ and $S_j$ have yet been recorded with the preparation $Pr_m$ and the echo time $TE_k$ (query 109, n), then the excitation 105 of echo signals and the recording 107 of scan data with changed encoding gradients can be repeated until all the desired scan data of the first and the at least one second slice $S_i$ and $S_j$ have been recorded with the preparation $Pr_m$ and the echo time $TE_k$.

It can further be checked whether scan data from all the slices $S_1 \ldots S_N$ to be scanned have already been carried out (query 111) with all the desired preparations $Pr_1 \ldots Pr_M$ and all the desired echo times $TE_1 \ldots TE_K$ (query 111). If this is not the case (query 111, n), the excitation 105 of echo signals and the recording 107 of scan data is repeated with an altered (still lacking) preparation $PR_m'$ for a (possibly altered) first slice $S_i'$ and/or with an altered (still lacking) echo time $TE_k'$ for at least one (possibly altered) second slice $Sj'$.

The excitation 105 of the echo signals in the first and second slices $S_i$ and $S_j$ and the recording 107 of the echo signals generated is thus repeated using different preparations $Pr_m$ of the desired preparations $Pr_1 \ldots Pr_M$ on excitation 105.$a$ of the first slices $S_j$ and realization of different echo times $TE_k$ of the desired echo times $TE_1 \ldots TE_K$ on excitation 105.$b$ of the second slices $S_j$ until all the slices $S_1 \ldots S_N$ to be scanned have been excited at least once with each desired preparation $Pr_1 \ldots PR_M$ and at least once with each desired echo time $TE_1 \ldots TE_K$, and the echo signals generated thereby have been stored in a scan data set $MD_{imjk}$.

In the query 111, it can also be taken into account as to whether possibly scan data of a slice $S_i$ and/or $S_j$ should be recorded in a number of repetitions with the same preparation $Pr_m$ or with the same echo time $TE_k$. This may be specifically desired in order to improve the signal-to-noise ratio achieved, or to lessen a movement and/or flow sensitivity of the scan, or because more different preparations $Pr_1 \ldots Pr_M$ are desired than different echo times $TE_1 \ldots TE_K$ (thus M>K), and therefore scan data of selected echo times $TE_k$ can be recorded a plurality of times, or analogously vice versa (K>M).

The query 109 need not necessarily be made before the query 111, but for example, segmented recordings of only a portion of the scan data of different slices $S_i$, $S_j$, $S_i'$, $S_j'$ can be carried out one after another. This can be useful if the sequence of the totality of repetitions of the recording 105 of scan data to be carried out is to be as freely configurable as possible, for example, in order to be able to configure a loading on the gradient system and/or the RF antennae as small as possible.

Once all the scan data of the first slice and the at least one second slice $S_i$ and $S_j$ with a preparation $Pr_m$ and an echo time $TE_k$ have been recorded (query 109, y), then from the stored scan data set $MD_{imjk}$, a scan data set $MD_{im}$ prepared according to the preparation $PR_m$ of the slice $S_i$ can be created, and for each second excited slice $S_j$, a scan data set $MD_{jk}$, weighted according to the echo time $TE_k$ following a transverse decay, of the respective slice j can be created (block 113). Whether the scan data set $MD_{jk}$ is a T2-weighted or a T2*-weighted scan data set depends on the sequence type used for the excitation 105 of echo signals and the recording 107 of scan data. If spin echoes have been created and recorded, a T2-weighted scan data set $MD_{jk}$ can be created. If gradient echoes have been created and recorded, a T2*-weighted scan data set $MD_{jk}$ can be created. It is also conceivable in the repetitions 105 to generate both gradient echo signals and also spin echo signals, for example, in different second slices $S_j$. An example of this type is described below in relation to FIGS. 4 to 6.

If the scan data of the slices $S_i$ and $S_j$ are already present in the scan data set $MD_{imjk}$ separately according to the individual slices $S_i$ and $S_j$, then the scan data sets $MD_{im}$ and $MD_{jk}$ can be created without further effort. If scan data of the slices $S_i$ and $S_j$ is present collapsed in the scan data set $MD_{imjk}$, then the creation of the scan data sets $MD_{im}$ and $MD_{jk}$ can involve a separation of the collapsed scan data set $MD_{imjk}$ into the respective scan data sets $MD_{im}$ and $MD_{jk}$ containing only scan data of the individual slices (single slice scan data). This can take place using a parallel acquisition technique, for example, using techniques known from slice multiplexing methods, in particular a slice-GRAPPA technique.

On the basis of the stored scan data sets $MD_{imjk}$, image data $MD_{im}$ and/or $MD_{jk}$ weighted according to the respective echo time $TE_k$ and/or the respective preparation $Pr_m$ can be reconstructed. The reconstruction of the image data can take place in the usual manner and can comprise, in particular, a Fourier transform.

For this purpose, image data $BD_{im}$ weighted according to the preparation $Pr_m$ can be reconstructed (block 115.$a$) from the scan data sets $MD_{im}$ created. Furthermore, from the scan data sets $MD_{jk}$ created, image data $BD_{jk}$ can be reconstructed (block 115.$b$) that, depending on the echo time $TE_k$ and the type of the underlying echo signals recorded, are T2-weighted or T2*-weighted.

If all the scan data (query 109, y) of all the slices $S_1 \ldots S_N$ to be scanned have already been recorded (query 111, y) with all the desired preparations $Pr_1 \ldots Pr_M$ and all the desired echo times $TE_1 \ldots TE_K$ (query 111, y), then the recording of scan data is ended, and for each stored scan data set $MD_{imjk}$ written on the basis of the blocks 113, 115.$a$ and 115.$b$, a preparation-weighted image data set $BD_{im}$ and at least one image data set $BD_{jk}$ weighted according to a transverse decay (T2 or T2*) can be reconstructed.

With the inventive method, scan data are obtained for each desired contrast, in each case with different contrasting parameters. From scan data sets recorded with different contrasting parameters, image data of a desired contrast, belonging in each case to the different contrasting parameters, can be reconstructed. From image data of a desired contrast belonging to different contrasting parameters and representing, for example, a slice in an examination object, at least one parameter map of a parameter characterizing a material present in the examination object, in particular of a parameter typical of a tissue, can be determined. This can take place, for example, by comparison of the image data of the respective different contrasting parameters with the conformities known via the parameters being sought, in particular making use of a fit. The comparison can take place image element-by-image element (pixels or voxels).

From at least two different preparation-weighted image data $BD_{im}$ of a slice $S_i$ and thus on the basis of recorded scan data $MD_{imjk}$, a parameter map $KD_i$ of a parameter characterizing a material present in the examination object in the slice $S_i$ can be determined in a known manner (block 117.$a$). Examples of parameters, for which the distribution thereof in the slice $S_i$ can be determined from different preparation-weighted image data $BD_{im}$, dependent upon the preparation undertaken, are the proton density, the longitudinal magnetization decay (T1) and diffusion parameters.

From image data $BD_{jk}$ of a slice $S_j$ reconstructed from at least two scan data sets $MD_{jk}$ recorded at different echo times $TE_k$, and thus on the basis of recorded scan data $MD_{imjk}$, a parameter map $KD_j$ of a parameter characterizing a material present in the examination object in the slice $S_j$ can be determined in a known manner (block 117.$b$). Examples of parameters, of which the distribution thereof in the slice $S_j$ can be determined from reconstructed image data $BD_{jk}$ making use of different echo times of recorded scan data sets $MD_{jk}$, are (possibly dependent upon the echo signals generated) the proton density, the transverse magnetization decay (T2) and the effective transverse magnetization decay (T2*).

Figure 3:
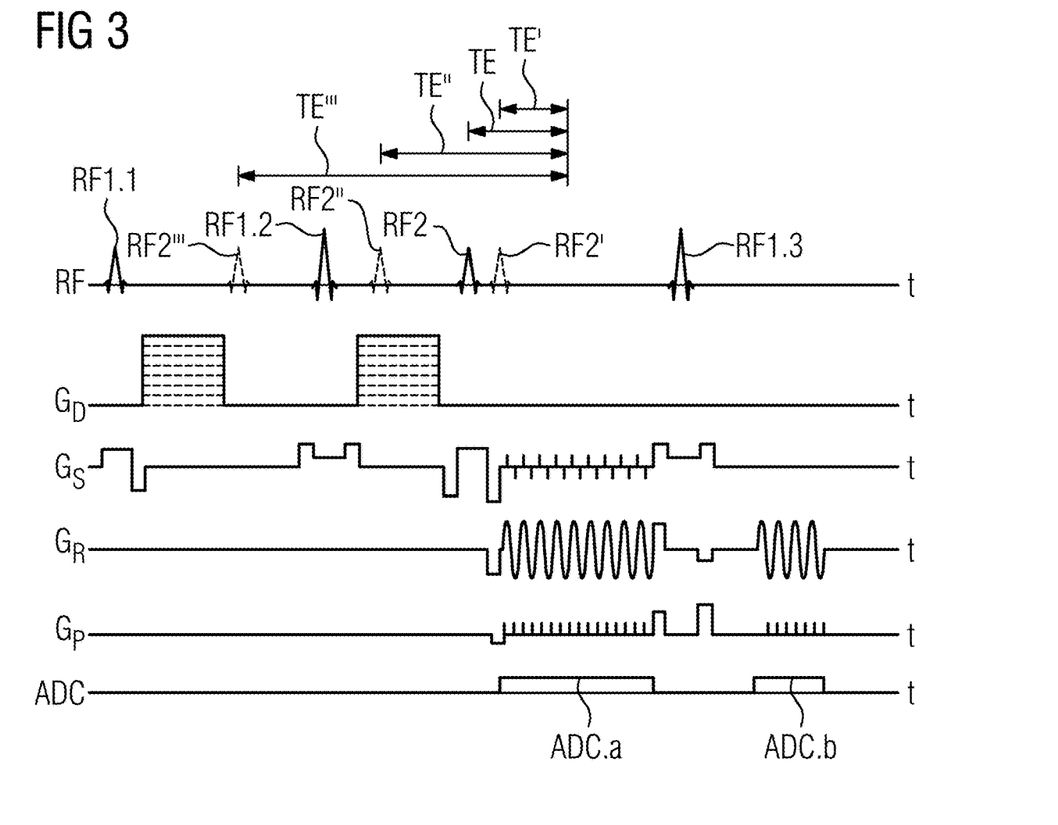
FIGS. 3-6 are further switching diagrams of repetitions according to the invention.

FIG. 3 shows a further possible switching diagram of an inventive repetition taking the example of a diffusion preparation, wherein the shape of RF pulses, of gradients $G_D$ switched in the diffusion direction, of gradients $G_S$ switched in the slice selection direction, of gradients $G_R$ switched in the readout direction and of gradients $G_P$ switched in the phase encoding direction and of data readout times ADC against time t are shown.

In the context of a diffusion preparation, in at least one repetition, at least one diffusion gradient $G_D$ is switched in at least one diffusion direction D. The b-value of the switched diffusion gradients can be altered for different repetitions, e.g. over a variation of the strength (amplitude) of the switched diffusion gradients or over a variation of the duration of the switched diffusion gradients. This is indicated in a simplified manner by the different diffusion gradients $G_D$ being shown dashed, which can be switched in other repetitions. Usually, in the context of a diffusion scan in different repetitions, diffusion preparations with at least two different b-values (e.g. b=0 and b=1000) are undertaken in a number of, e.g. four, diffusion directions. In order to improve, for example, the signal-to-noise ratio, repetitions with the same preparation can be recorded repeatedly.

In the example shown, the diffusion preparation of the first slice is further brought about in the usual manner with the use of an RF excitation pulse RF1.1 and an RF refocusing pulse RF1.2. Furthermore, as in the example shown, a further RF refocusing pulse RF1.3 can be radiated in order to generate further echo signals in the first slice which can be recorded in a readout step ADC.b, for example, as navigator data. Alternatively, if the RF refocusing pulse RF1.3 also acts on the at least one second slice, such further echo signals can be recorded as further scan data at a further echo time.

Whereas in one repetition echo signals are generated in a first slice using a (diffusion) preparation, in the same repetition echo signals are generated in at least one second slice after an echo time TE following an excitation of the at least one second slice with at least one RF excitation pulse RF2. In the example shown, the echo signals generated in the first slice and in the at least one second slice are simultaneously recorded in a readout step ADC.a collapsed as scan data in a scan data set. The scan data recorded collapsed can be separated with the use of techniques known from slice multiplexing methods into scan data sets that each contain only scan data of the individual slices. If echo signals are generated in more than one second slice with RF excitation pulses RF2, RF2', RF2'', RF2''', the RF excitation pulses RF2, RF2', RF2'', RF2''' can be configured, for example, as multi-band RF pulses that excite all of the second slices simultaneously.

The echo signals generated can here be recorded, as in the example shown, with an EPI sequence which switches an oscillating readout gradient $G_R$ and gradient blips in the phase encoding direction P during the readout step ADC.a, in order to record the echo signals. Herein, in one repetition in a readout step ADC.a, all the scan data of a slice can be recorded ("single shot EPI") or in a number of repetitions, in each case, one sampled portion of the scan data to be recorded for a slice can be recorded, each in a segment in the k-space ("segmented EPI"). From the scan data of the gradient echo signals of the at least one second slice generated in the context of the EPI sequence, T2*-maps can be generated.

It is also possible to record the scan data generated with a (diffusion) TSE sequence (not shown), whereby then from scan data of the spin echo signals of the at least one second slice generated in the context of the TSE sequence, T2-maps can be generated.

Both EPI and TSE sequences belong to the multi-echo sequences in which following an excitation, a plurality of, i.e. at least two, echo signals are generated in the excited slice and recorded.

In further repetitions, the RF excitation pluses exciting at least one second slice can be placed at a different temporal position in order to obtain other echo times TE. For example, with an RF excitation pulse RF2' in the at least one second slice after an echo time TE', echo signals can be recorded.

In particular, in repetitions with a diffusion preparation with a b-value b=0, i.e. in repetitions in which a diffusion gradient of strength zero (that is, effectively no diffusion gradient) is switched, RF excitation pulses RF2'', RF2''' to generate echo signals in at least one second slice can also be placed temporally further from the readout step ADC.a, e.g. between the RF excitation pulse RF1.1 and the refocusing pulse RF1.2 or shortly after the RF refocusing pulse RF1.2, in order to achieve long echo times TE'' or TE'''. Such long echo times TE'', TE''' in combination with relatively markedly shorter echo times TE, TE', enable a more exact determination of transverse decay constants.

Figure 4:
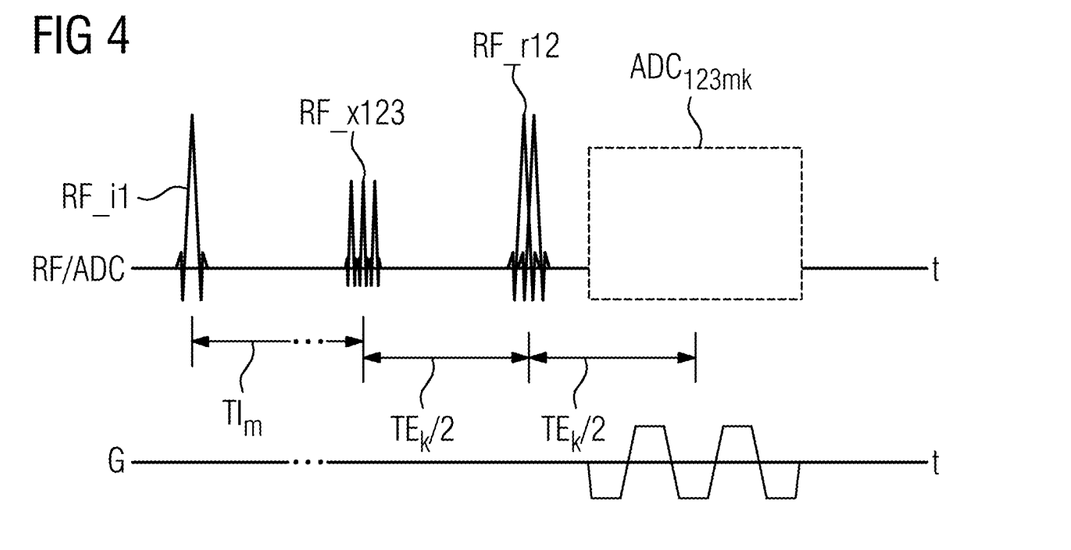
Figure 5:
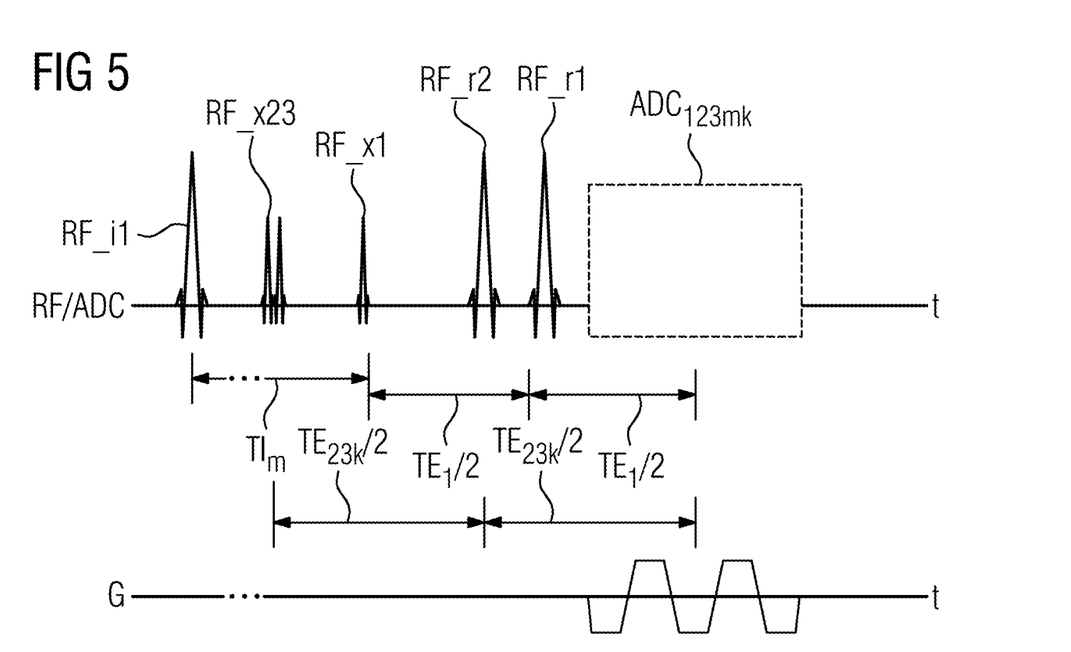
Figure 6:
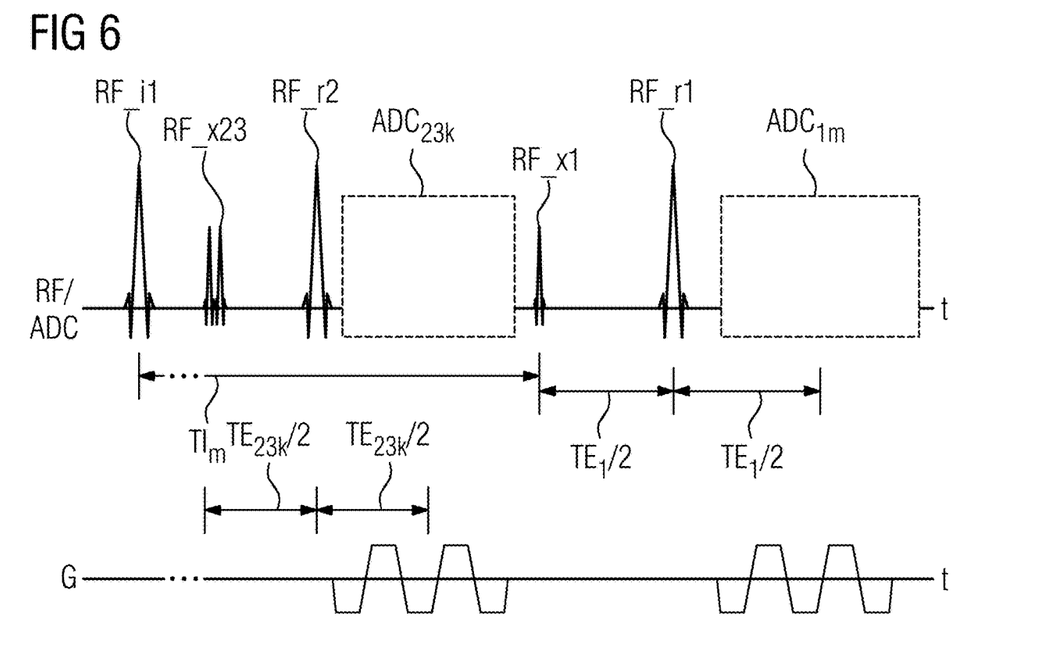

In FIGS. 4 to 6, further examples of switching diagrams of repetitions according to the invention are shown, this time using the example of a preparation which comprises at least one RF inversion pulse RF-i1. In the switching diagrams of FIGS. 4 to 6, in each case, the shape over time t of RF pulses is shown together with readout steps ADC in the respective upper line and of gradients G (e.g. an EPI readout gradient) switched, for example, during readout steps in the respective bottom line.

In FIG. 4, first an RF inversion pulse RF_i1 acting on a first slice 1 is radiated, which is followed after an inversion time $Ti_m$ by an RF excitation pulse RF_x123. The inversion time $TI_m$ is one of at least two inversion times $TI_1$ to $TI_M$ belonging to different preparations. In the example of FIG. 4, the RF excitation pulse RF_x123 is configured as a multi-band RF pulse, which acts simultaneously on the first slice 1 and on a first second slice 2 and on a second second slice 3, in order to generate echo signals of the slices 1, 2 and 3 which are recorded collapsed in the readout step $ADC_{123mk}$ and can be separated using techniques known from slice multiplexing methods into scan data sets of the individual slices.

In order to generate inversion prepared echo signals in the first slice 1, after a half echo time $TE_k/2$, an RF refocusing pulse RF_r12 which in the example shown acts not only on the first slice 1, but—again particularly as a multi-band RF pulse—also on the first second slice 2, is radiated, so that in the first second slice, spin echo signals are generated. In the second second slice 3, the spins are excited only by the RF excitation pulse RF_r123, so that gradient echo signals are generated and in the readout step $ADC_{123mk}$ are recorded. In the example of FIG. 4, the echo time $TE_k$ for all slices 1, 2, 3 is the same.

In order to be able to generate a transverse decay of differently weighted echo signals, the echo time used in the first and second second slice 2 and 3 must be varied in at least one repetition. Therefore, in FIG. 5, the switching diagram of FIG. 4 is changed such that in the first second slice 2 and in the second second slice 3, echo signals are generated and recorded after a common echo time $TE_{23k}$, but the inversion-prepared echo signals of the first slice 1 are generated and recorded with an echo time $TE_1$ different from the echo time $TE_{23k}$.

In a repetition according to an example shown in FIG. 5, in the first slice 1, an RF inversion pulse RF_i1 and following an inversion time $TI_m$, an RF excitation pulse RF_x1 and thereafter, following a half echo time $TE_1/2$, an RF refocusing pulse RF_r1 is radiated, in order following the echo time $TE_1$ after the RF excitation pulse RF_x1, to generate inversion-prepared echo signals. In the same repetition, following the RF inversion pulse RF_i1, an RF excitation pulse RF_x23 is radiated, the spins excited in the first and second second slice 2 and 3 and gradient echo signals of the second second slice 3 are generated. For this purpose, the RF excitation pulse RF_x23 can be configured as a multi-band RF pulse. After a half echo time $TE_{23k}/2$ following the radiated RF excitation pulse RF_x23, an RF refocusing pulse RF_r2 is radiated which refocuses the spins in the first second slice 2 and after the echo time $TE_{23k}$ following the radiated RF excitation pulse RF_x23, spin echo signals of the first second slice are generated. The generated inversion-prepared echo signals of the first slice 1, the generated spin echo signals of the first second slice 2 and the generated gradient echo signals of the second second slice 3 are, similarly to FIG. 4, recorded collapsed in the readout step $ADS_{123mk}$.

In FIG. 6, a further switching diagram of a repetition with inversion-preparation is shown which can be advantageous, in particular for long inversion times $TI_m$.

If repetitions with long desired inversion times $TI_m$ are carried out, RF pulses acting upon the first and second second slice 2 and 3 and readout steps $ADC_{23k}$ recording echo signals of the first and second second slice 2, 3 can be inserted between the inversion pulse RF_i1 acting upon the first slice 1 and the readout step $ACD_{1m}$ recording the inversion-prepared echo signals of the first slice 1. It can even be possible to insert RF pulses acting upon the first and second second slice 2 and 3 and readout steps $ADC_{23k}$ recording echo signals of the first and second second slice 2, 3 between the inversion pulse RF_i1 acting upon the first slice 1 and the RF excitation pulse RF_x1 acting upon the first slice 1.

In FIG. 6 also, in a first slice 1, inversion-prepared echo signals, in a first second slice 2 spin-echo signals and in a second second slice 3, gradient echo signals are generated. As already shown in FIG. 5, in the example shown here, in the first second slice 2 and in the second second slice 3, echo signals are generated and recorded according to a common echo time $TE_{23k}$, but the inversion-prepared echo signals of the first slice 1 are generated and recorded with an echo time $TE_1$ different from the echo time $TE_{23k}$.

Thus, the switching diagram of FIG. 6 for the first slice 1 is again altered only in respect of the duration of the inversion time $TI_m$ relative to the switching diagrams of FIGS. 3 and 5. Thus, between the RF inversion pulse RF_i1 and the RF excitation pulse RF_x1, a longer inversion time $TI_m$ passes here. The RF refocusing pulse RF_r1, however, is arranged unchanged after a half echo time $TE_1/2$ following the RF excitation pulse RF_x1 and the readout step $ADC_{1m}$ after a full echo time $TE_1$ following the RF excitation pulse RF_x1.

In comparison with FIG. 5, however, in FIG. 6 all RF pulses RF_x23, RF_r2 acting upon the second slices 2, 3 are arranged temporally between the inversion pulse RF_i1 and the RF excitation pulse RF_x1 of the first slice. For clarity, in FIG. 6 also, the case is shown that the second slices 2 and 3 are simultaneously excited with an RF excitation pulse RF_x23 configured as a multi-band RF pulse and the echo signals generated in the second slices 2, 3 are recorded collapsed in a readout step $ADC_{23k}$, whereby here, known techniques from slice multiplexing methods are used. In the example shown, the readout step $ADC_{23k}$ also lies temporally between the inversion pulse RF_i1 and the RF excitation pulse RF_x1 of the first slice.

It is also conceivable, but not shown, with correspondingly long inversion times $TI_m$ and thus within the temporal space required for the repetition, also to radiate separately the RF pulses which act respectively on the first and second second slice as individual RF pulses and also to carry out readout steps $ADC_2$ and $ADC_3$ for echo signals of the first and second second slice 2 and 3 separately. This may be useful for repetitions in which recordings of echo signals of the first and second second slices 2, 3 at further (also respective) different echo times are desired. For example, the (individual) RF excitation pulses to be radiated respectively for the first and second second slice 2 and 3 and the RF refocusing pulse to be radiated into the first second slice 2 can be radiated temporally following the inversion pulse RF_i1 radiated into the first slice 1 and the associated RF excitation pulse RF_x1. The readout steps for recording the echo signals of the first and second second slice 2 and 3, however, can be carried out temporally following the RF excitation pulse RF_x1 of the first slice 1 and before the readout step $ADC_{1m}$ of the recording of the echo signals of the first slice 1.

In the switching diagrams of FIGS. 4 to 6, in a repetition in a first slice 1, inversion-prepared echo signals, in a first second slice 2 by an RF refocusing pulse, refocused spin echo signals and in a second second slice 3, by means of an RF excitation pulse, gradient echo signals are generated. FIGS. 4 to 6 therefore give examples of how in a respective repetition, simultaneously inversion-prepared echo signals, by means of RF refocusing pulses, refocused T2-weighted spin echo signals and T2*-weighted gradient echo signals can be generated in respective different slices.

In comparison with respective individually performed scans, such as those proposed in the aforementioned article by Poupon et al., by means of respective simultaneous scans of differently weighted echo signals from respective different slices, the scan time can be shortened by a factor which corresponds approximately to the number of the slices from which echo signals are recorded in each repetition. As already mentioned, the repetition time TR according to which excitations for generating echo signals and recordings of the echo signals generated can be repeated, in contrast-weighted scans the repetition time of which depends on the desired contrast cannot be shortened by known slice multiplexing methods. However, with a method according to the invention which in a repetition generates different contrast weightings interleaved in different respectively different slices, nevertheless, a significant time gain can be achieved in the generation of different contrast-weighted scan data, since, for example, inversion times TI or repetition times TR to be awaited in a slice can be used for the manipulation of at least one other slice.

The scan data of different slices possibly recorded collapsed can be separated using techniques known from slice multiplexing methods into inversion-prepared scan data sets, T2-weighted scan data sets and T2*-weighted scan data sets of respectively all the scanned slices. Thus, from scan data sets of first slices 1, at least one map of a parameter dependent on the invention time TI can be created, from scan data sets of first second slices 2, a T2-map and from scan data sets of second second slices 3, a T2*-map (and respectively a proton density map) can be created.

The switching diagrams of FIGS. 4 to 6 give examples of possible switchings of RF pulses to be radiated and readout steps to be switched, wherein the RF pulses to be radiated act partially on a plurality of slices and can be radiated offset to one another in different repetitions. Which type of switching diagram is used in a particular repetition depends in particular on the desired preparations, in this case therefore, for example, on the desired different inversion times $TI_m$ and on the desired different echo times $TE_k$ after which echo signals are to be recorded in the second slices 2, 3.

Figure 7:
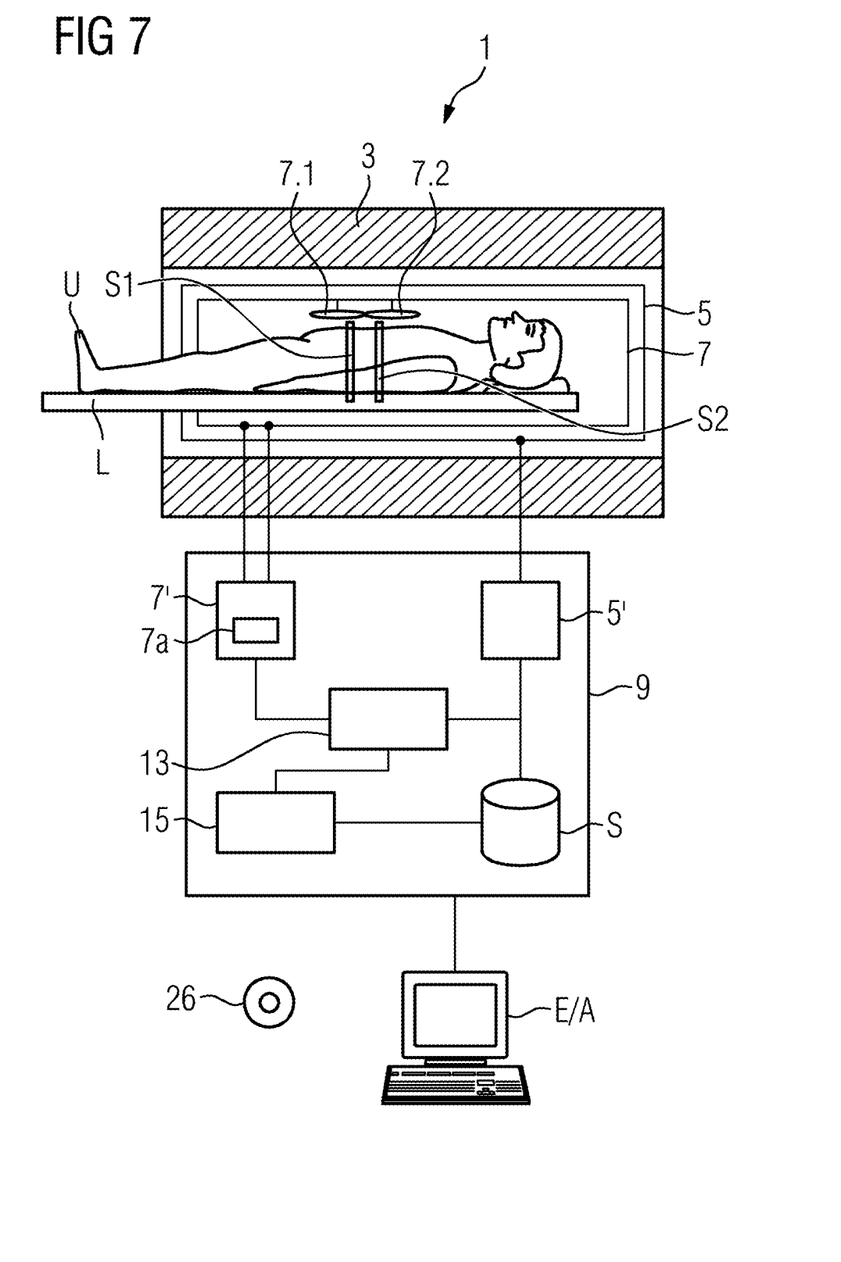
FIG. 7 is a schematic illustration of a magnetic resonance apparatus according to the invention.

FIG. 7 schematically illustrates an inventive magnetic resonance apparatus 1. This has a scanner with a basic field magnet 3 that generates the basic magnetic field, a gradient coil arrangement 5 that generates the gradient fields, a radio-frequency antenna 7 that radiates and receives radio-frequency signals, and a control computer 9 configured to implement the method according to the invention. In FIG. 7, these subunits of the magnetic resonance apparatus 1 are shown only schematically. In particular, the radio-frequency antenna 7 can be formed by, for example, at least two coils such as the schematically shown coils 7.1 and 7.2, which can be configured either only to transmit radio-frequency signals, or only to receive the triggered radio-frequency (MR) signals, or for both.

In order to examine an examination object U, for example, a patient or a phantom, the object U is introduced on a table L into the scanner of the magnetic resonance apparatus 1, in the scanning volume thereof. The slices S1 and S2 represent, as an example, two different slices S1 and S2 of the examination object U, which can be scanned simultaneously during a recording of MR signals.

The control computer 9 serves to control the magnetic resonance apparatus 1 and controls the gradient coil arrangement 5 via a gradient controller 5' and the radio-frequency antenna 7 via a radio-frequency transmission/receiving controller 7'. The radio-frequency antenna 7 can have multiple channels via which signals can be transmitted or received individually.

The radio-frequency antenna 7 is responsible, together with the radio-frequency transmission/receiving controller 7', for the generation and radiation (transmission) of a radio-frequency alternating field for manipulation of the nuclear spins in a region from which MR data are be acquired (for example, in different slices S1 and S2 to be scanned) of the examination object U. The center frequency of the radio-frequency alternating field, also designated the B1 field, must lie close to the resonant frequency of the type of nuclear spins to be manipulated. In order to generate the B1 field, in the radio-frequency antenna 7, currents controlled by the radio-frequency transmission/receiving controller 7' are applied to the RF coils. The radio-frequency antenna 7 is configured to generate RF pulses suitable for slice multiplexing methods, for example with suitably applied additional phases. A multi-band RF pulse processor 7a, which can be included in the radio-frequency transmission/receiving controller 7', calculates multi-band RF pulses for simultaneous manipulation of different slices S1, S2 in the examination object U.

Furthermore, the control computer 9 has a preparation/echo time processor 15 that determines sequences of RF pulses to be radiated and gradients to be switched, in order to realize the desired preparations and echo times.

A sequence processor 13 included in the control computer 9 is configured to carry out all the computation operations necessary for the required scans and determinations. Preliminary results needed for this, and the determined results, can be stored in a memory S of the control computer 9. In particular, the sequence processor 13 is also configured to separate scan data of different slices recorded collapsed in a scan data set into scan data of the respective individual slices. The processors shown herein need not necessarily to be understood as physically separate units, but represent merely a subdivision into functional units, which can be realized in fewer units or only in one single physical unit.

Via an input/output device E/A of the magnetic resonance apparatus 1, control commands can be entered by a user into the magnetic resonance apparatus 1 and results from the control computer 9 such as image data, can be displayed.

The steps described herein can exist in the form of computer code stored on electronically readable data storage medium 26. The data storage medium 26 can be loaded into the control computer 9 of the magnetic resonance apparatus 1, so as to cause the control computer 9 to operate the magnetic resonance apparatus 1 in order to implement the method described herein.

Although modifications and changes may be suggested by those skilled in the art, it is the intention of the Applicant to embody within the patent warranted hereon all changes and modifications as reasonably and properly come within the scope of the Applicant's contribution to the art.

The invention claimed is:

1. A method for generating differently contrast-weighted magnetic resonance (MR) scan data of an examination object, said method comprising:
    (a) in a processor that is configured to operate an MR data acquisition scanner, selecting a number of different slices of the examination object from which MR scan data are to be acquired, and selecting a number of first contrasting scan parameters for generating scan data weighted with a first contrast, and selecting a number of second contrasting parameters for generating scan data represented with a second contrast, said first contrast and said second contrast being different from each other;
    (b) from said processor, operating said MR data acquisition scanner in order to excite nuclear spins in one of said different slices, using said first contrasting scan parameter;
    (c) from said processor, operating said MR data acquisition scanner in order to excite nuclear spins in at least one other slice among said different slices, using said second contrasting scan parameter;
    (d) from said processor, operating said MR data acquisition scanner in order to record echo signals produced by the nuclear spins excited in (b) and (c), as scan data, and storing said scan data in a scan data set;
    (e) with said processor, repeating (b) through (d) in repetitions respectively using different first contrasting scan parameters and using different second contrasting scan parameters, until nuclear spins in all slices of said different slices have been excited at least once with each first contrasting scan parameter and at least once with each second contrasting scan parameter, with echo signals produced in said repetitions also being stored in a scan data set.

2. A method as claimed in claim 1 comprising selecting at least one of said first or second contrasting scan parameters to be an echo time of said echo signals, and operating said MR data acquisition scanner in each repetition of (b) or (c) so as to excite said nuclear spins in said slice in (b) or said at least one other slice in (c) so as to produce the designated echo time.

3. A method as claimed in claim 1 comprising selecting said first contrasting scan parameter to designate a spin preparation for said nuclear spins excited in (b) and, in each repetition of (b), exciting said nuclear spins with the designated spin preparation.

4. A method as claimed in claim 3 comprising selecting said spin preparation as a preparation type from the group consisting of radiating at least one radio-frequency (RF) inversion pulse at a specified inversion time, and radiating at least one RF magnetization transfer pulse with a specified spectral selectivity.

5. A method as claimed in claim 3 comprising selecting said spin preparation as a diffusion preparation type selected from the group consisting of designating at least two different diffusion values, and designating at least two different diffusion directions.

6. A method as claimed in claim 1 comprising operating said MR data acquisition scanner to simultaneously excite said nuclear spins in (b) and (c), so that said scan data set is a collapsed scan data set comprising echo signals from both said slice in (b) and at said at least one other slice in (c).

7. A method as claimed in claim 6 comprising, in said processor, separating said collapsed scan data set into a plurality of slice-specific scan data sets respectively for the slice excited in (b) and said at least one other slice excited in (c), using a parallel acquisition separation technique.

8. A method as claimed in claim 1 comprising exciting said nuclear spins in each repetition of (b) and (c) by radiating at least one multi-band radio-frequency (RF) pulse that simultaneously manipulates the nuclear spins in at least two of the slices that are excited in (b) and (c).

9. A method as claimed in claim 1 comprising, in said processor, reconstructing image data from the stored scan data set, with said image data being weighted according to said first contrast and according to said second contrast.

10. A method as claimed in claim 1 comprising, in said processor, generating a parameter map from said stored scan data set that maps a parameter characterizing a material that is present in the examination object.

11. A method as claimed in claim 1 comprising operating said MR data acquisition scanner in (b) and (c) in order to generate said echo signals as either gradient echo signals or spin echo signals.

12. A method as claimed in claim 1 comprising operating said MR data acquisition scanner in either of (b) or (c) so as to produce two echo signals, which are acquired in (d).

13. A magnetic resonance (MR) apparatus comprising:
an MR data acquisition scanner;
a processor configured to operate an MR data acquisition scanner, by (a) selecting a number of different slices of the examination object from which MR scan data are to be acquired, and selecting a number of first contrasting scan parameters for generating scan data weighted with a first contrast, and selecting a number of second contrasting parameters for generating scan data represented with a second contrast, said first contrast and said second contrast being different from each other;
said processor being configured to (b) operate said MR data acquisition scanner in order to excite nuclear spins in one of said different slices, using said first contrasting scan parameter;
said processor being configured to (c) operate said MR data acquisition scanner in order to excite nuclear spins in at least one other slice among said different slices, using said second contrasting scan parameter;
said processor being configured to (d) operate said MR data acquisition scanner in order to record echo signals produced by the nuclear spins excited in (b) and (c), as scan data, and store said scan data in a scan data set;
said processor being configured to (e) repeat (b) through (d) in respective repetitions using different first contrasting scan parameters and using different second contrasting scan parameters, until nuclear spins in all slices of said different slices have been excited at least once with each first contrasting scan parameter and at least once with each second contrasting scan parameter, with echo signals produced in said repetitions also being stored in a scan data set.

14. A non-transitory, computer-readable data storage medium encoded with programming instructions, said storage medium being loaded into a computer of a magnetic resonance (MR) apparatus that comprises an MR data acquisition scanner, said programming instructions causing said computer to:
(a) select a number of different slices of the examination object from which MR scan data are to be acquired, and select a number of first contrasting scan parameters for generating scan data weighted with a first contrast, and select a number of second contrasting parameters for generating scan data represented with a second contrast, said first contrast and said second contrast being different from each other;
(b) operate said MR data acquisition scanner in order to excite nuclear spins in one of said different slices, using said first contrasting scan parameter;
(c) operate said MR data acquisition scanner in order to excite nuclear spins in at least one other slice among said different slices, using said second contrasting scan parameter;
(d) operate said MR data acquisition scanner in order to record echo signals produced by the nuclear spins excited in (b) and (c), as scan data, and store said scan data in a scan data set;
(e) repeat (b) through (d) in respective repetitions using different first contrasting scan parameters and using different second contrasting scan parameters, until nuclear spins in all slices of said different slices have been excited at least once with each first contrasting scan parameter and at least once with each second contrasting scan parameter, with echo signals produced in said repetitions also being stored in a scan data set.

* * * * *